(12) United States Patent
Yee

(10) Patent No.: US 6,369,333 B1
(45) Date of Patent: *Apr. 9, 2002

(54) FLEXIBLE CONNECTION SYSTEM

(75) Inventor: Dawson Yee, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,531

(22) Filed: Feb. 13, 1998

(51) Int. Cl.[7] .................................................. H01R 9/09
(52) U.S. Cl. ........................ 174/261; 174/207; 257/706; 301/700; 301/809; 439/92
(58) Field of Search ................................ 174/260, 261, 174/267, 138 G, 52.5, 52.6; 361/760, 809, 720, 719, 743, 758, 807; 257/678, 699, 206; 439/92, 97

(56) References Cited

U.S. PATENT DOCUMENTS

| | | | | |
|---|---|---|---|---|
| 4,498,120 A | * | 2/1985 | Kaufman | 361/720 |
| 4,546,408 A | * | 10/1985 | Rodseth et al. | 361/720 |
| 4,786,225 A | * | 11/1988 | Poe et al. | 411/32 |
| 4,927,367 A | * | 5/1990 | Salvagno | 439/92 |
| 4,929,185 A | * | 5/1990 | Wong et al. | 439/97 |
| 5,326,936 A | * | 7/1994 | Taniuchi et al. | 174/260 |
| 5,398,166 A | * | 3/1995 | Yonezawa et al. | 174/260 |
| 5,605,477 A | | 2/1997 | Wu et al. | |
| 5,621,363 A | | 4/1997 | Ogden et al. | |
| 5,624,277 A | | 4/1997 | Ward | |
| 5,669,789 A | | 9/1997 | Law | |
| 5,825,633 A | * | 10/1998 | Bujalski et al. | 174/138 G X |
| 5,838,551 A | | 11/1998 | Chan | |
| 5,990,549 A | * | 11/1999 | Chiu et al. | 257/706 |

OTHER PUBLICATIONS

Cunavelis et al., "External Module Heat Sink Fastened to Board", IBM Technical Disclosure Bulletin, vol. 14, No. 1, p182, 361/720, Jun. 1971.*
"80960RX Debug Connector Design Guide", Intel Data Sheet, Rev. 4, Aug. 1997.
"EMI Design Guidlines for USB Components", Intel Data Sheet, pp 1–19.
"Mechanical Assembly and Customer Manufacturing Technology for S.E.C. Cartridge Processors", Intel Data Sheet, AP–588 Application Note, Jul. 1997, pp. 1–53.
"Single Edge Contact (S.E.C) Cartridge", Intel Data Sheet, 1998 Packaging Databook, pp. 16–1 to 16–44.

* cited by examiner

Primary Examiner—Albert W. Paladini
(74) Attorney, Agent, or Firm—Blakely, Sokoloff, Taylor & Zafman LLP

(57) ABSTRACT

A method and apparatus for a connection system to a substrate is provided. The system includes a substrate having a mounting hole to permit an object to be coupled to the substrate. The substrate further includes a conductive pattern around the mounting hole on the substrate. The conductive pattern is designed to contact an interface, and selectively couple a ground signal to the object coupled to the substrate.

15 Claims, 7 Drawing Sheets

FLEXIBLE CONNECTION SYSTEM

FIELD OF THE INVENTION

The present invention relates to substrates, and more specifically, to a connection to a substrate.

BACKGROUND

Various devices are often attached to substrates. In some cases, such devices are encased in a conductive receptacle. The conductive receptacle is attached to mounting holes in the substrate.

FIG. 1 illustrates one prior art attachment mechanism. The substrate (PCB) 110 includes a number of mounting holes 120, 150, for connecting various components to the substrate 110. A device is attached to the substrate 110 using a mounting screw 140. (the device is not shown for clarity). Two types of mounting holes 120, 150 are illustrated. A first mounting hole 120 is drilled through the substrate 110. The first mounting hole 120 includes a plating 130 of tin or solder on the inside of the mounting hole. This plating 130 contacts the back-side 160 of the substrate 110. The back-side 160 of the substrate 110 includes a ground plane 170. Thus, if the conductive receptacle is coupled to the first mounting hole 120, the conductive receptacle is grounded. The conductive receptacle is coupled though the plating 130 to the ground plane 170. This grounds the conductive receptacle to the ground plane 170.

A second mounting hole 150 is also shown. The second mounting hole 150 is not plated. Therefore, if the conductive receptacle is coupled to the second mounting hole 150, the conductive receptacle is not grounded.

In the prior art, the decision to ground a receptacle must be made prior to manufacturing, when the substrate 110 is initially designed. Either the receptacle is designed to be grounded, or the receptacle is designed to be not grounded. One prior art solution to this is the inclusion of two sets of mounting holes 120, 150 in the substrate. If the receptacle is to be grounded, the receptacle is attached to a first, plated, mounting hole set 120. If the receptacle is not to be grounded, the receptacle is attached to a second, non-plated, mounting hole set 150. This means that the traces and connections to the receptacle are duplicated around each set of mounting holes 120, 150. Additionally, more real-estate is used on the substrate 110. And, finally, half the mounting holes 120, 150 are not used, since for each receptacle two sets of mounting holes 120, 150 are prepared. This increases manufacturing cost and complexity.

SUMMARY OF THE INVENTION

A connection system to a substrate is described. The system includes a substrate having a mounting hole designed to permit an object to be coupled to the substrate. The substrate further includes a conductive pattern around the mounting hole on the substrate. The conductive pattern is designed to contact an interface, and selectively couple a signal to the object coupled to the substrate.

BRIEF DESCRIPTION OF THE DRAWINGS

The present invention is illustrated by way of example, and not by way of limitation, in the figures of the accompanying drawings and in which like reference numerals refer to similar objects and in which.

DETAILED DESCRIPTION

An apparatus designed to couple an object to a substrate is described. Specific materials are mentioned throughout this specification. However, one skilled in the art understands that other similar materials may be used without departing from the scope of the invention.

Figure 1:
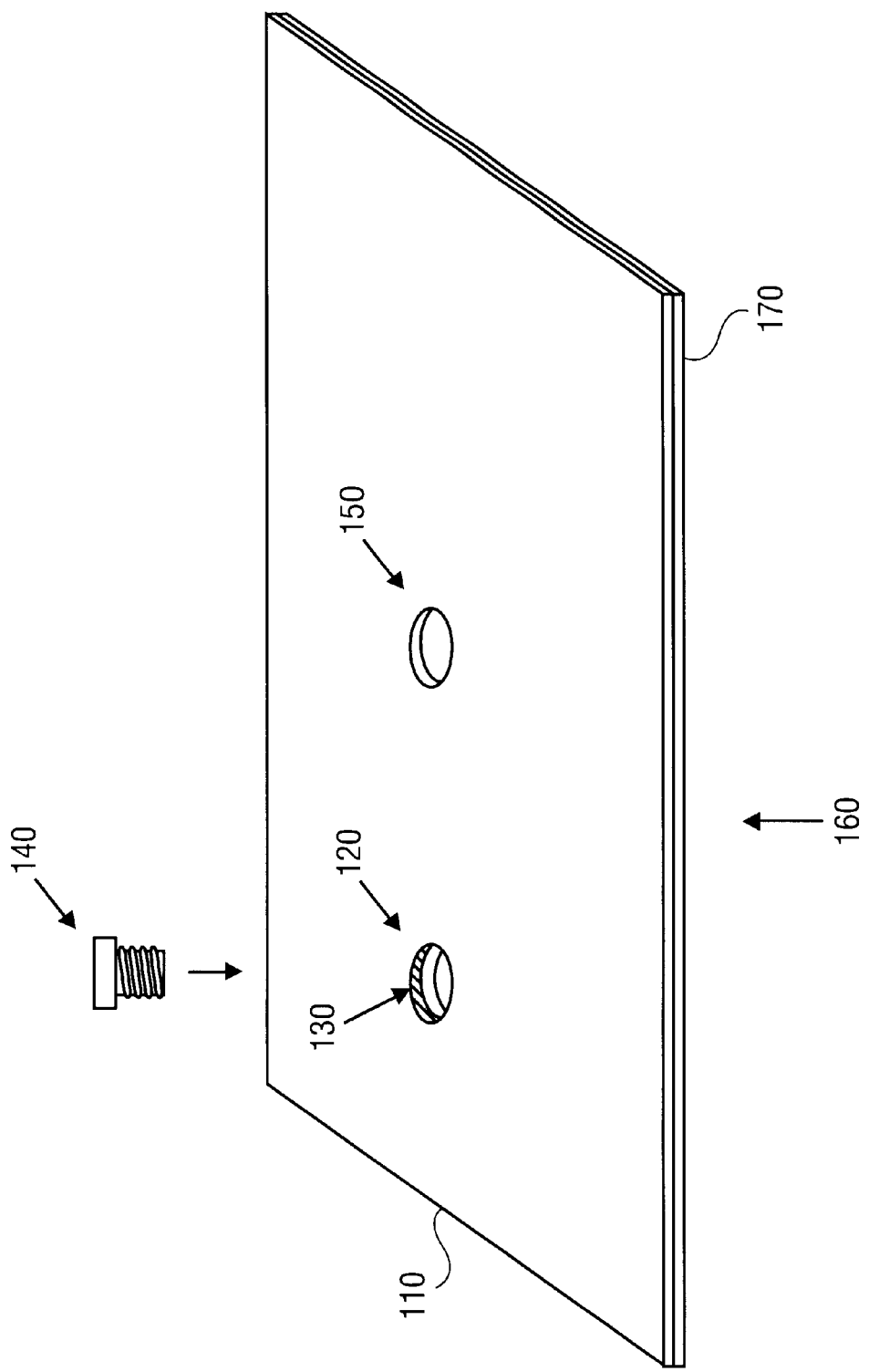
FIG. 1 is an illustration of a prior art attachment mechanism.
Figure 2:
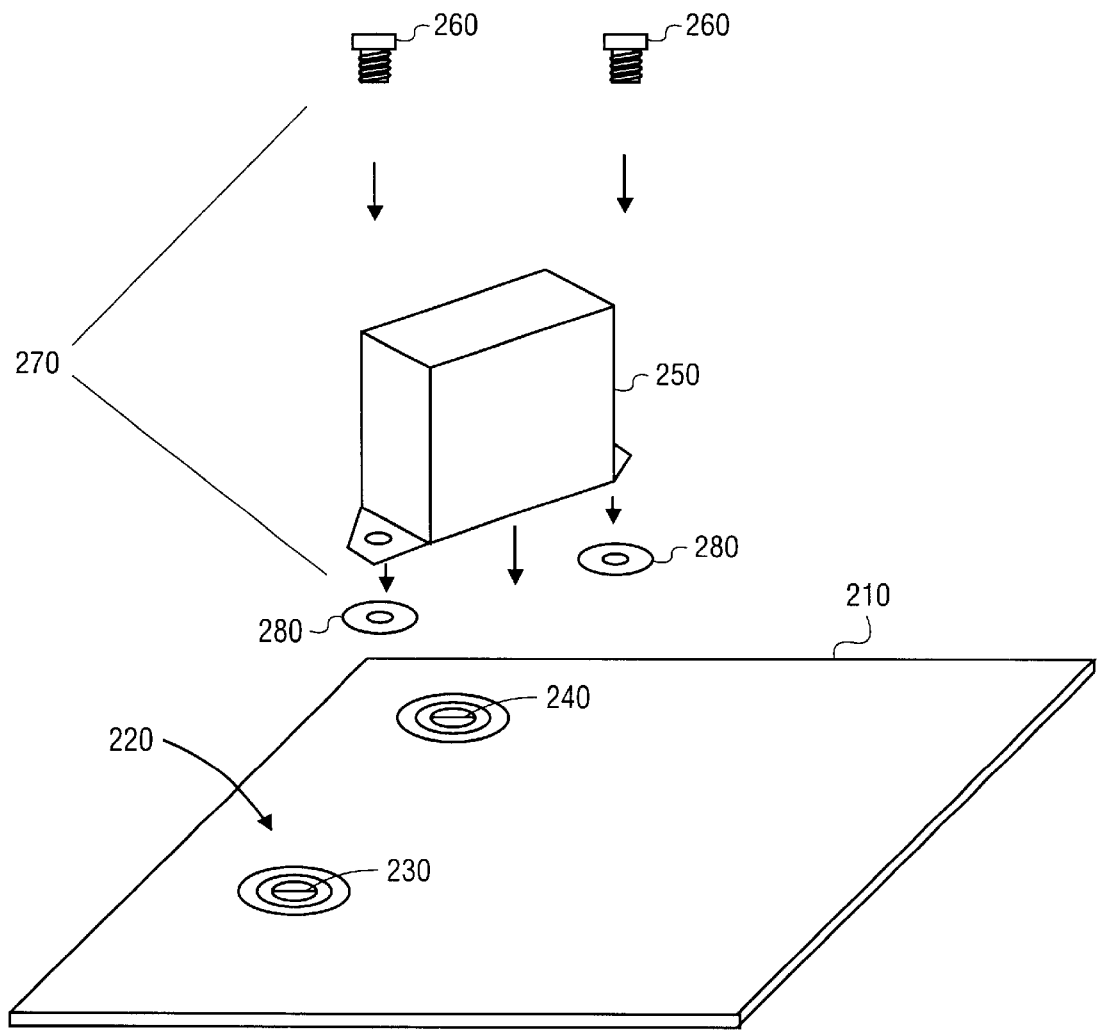
FIG. 2 is an illustration of one embodiment of a system according to the present invention.

FIG. 2 is an illustration of a system according to the present invention. A substrate 210 is provided. For one embodiment, the substrate 210 is a printed circuit board 210. For another embodiment, the substrate 210 is a motherboard. For another embodiment, the substrate 210 is a semiconductor substrate, a ceramic substrate, a fiberglass substrate, or made of other materials.

The substrate 210 includes a set of mounting holes 230 for mounting an object 250 to the substrate 210. For one embodiment, two mounting holes 230 comprise a set. Alternatively, four mounting holes 230 or another number of mounting holes 230 may be used. The mounting holes 230 do not have plating, coupling them to a ground. For one embodiment, the mounting holes 230 are insulated from ground. For one embodiment, the ground is a substrate ground on the back-side of the substrate 210.

The mounting holes 230 are a part of a mounting construction 220. The mounting construction 220 includes a mounting hole 230 and a conductive pattern 240 on the substrate 210. The conductive pattern 240 is on the top surface of the substrate 210. For one embodiment, the conductive pattern 240 is shaped like an annular ring.

An object 250 is designed to be attached to the substrate 210. The object 250 is conductive. An interface 280 is placed between the conductive pattern 240 and the object 250. A mounting device 260 is used to attach the object 250 to the substrate 210. For one embodiment, the mounting device 260 is a screw, a rivet, a bolt, a pin, a clip, or a similar apparatus to removably couple an object 250 to a substrate 210. The mounting device 260 and the interface 280 together form a mounting mechanism 270.

For one embodiment, the presence of the interface 280 determines whether or not the object 250 is grounded. If no interface is present, the object 250 is not grounded.

For another embodiment, the material used for the interface 280 determines whether the object 250 is coupled to ground or not. For one embodiment, the interface 280 is made of a conductive material. If the interface 280 is of a conductive material, the object 250 is electrically coupled to the conductive pattern 240 on the substrate 210. This is useful, as will be described below. For one embodiment, the interface 280 is made of metal. If the interface 280 is of a non-conductive material, the object 250 is electrically isolated from the conductive pattern 240 on the substrate 210. This is useful, as will be described below. For one embodiment, the non-conductive interface 280 is made of plastic, nylon, or ceramic.

Figure 3:
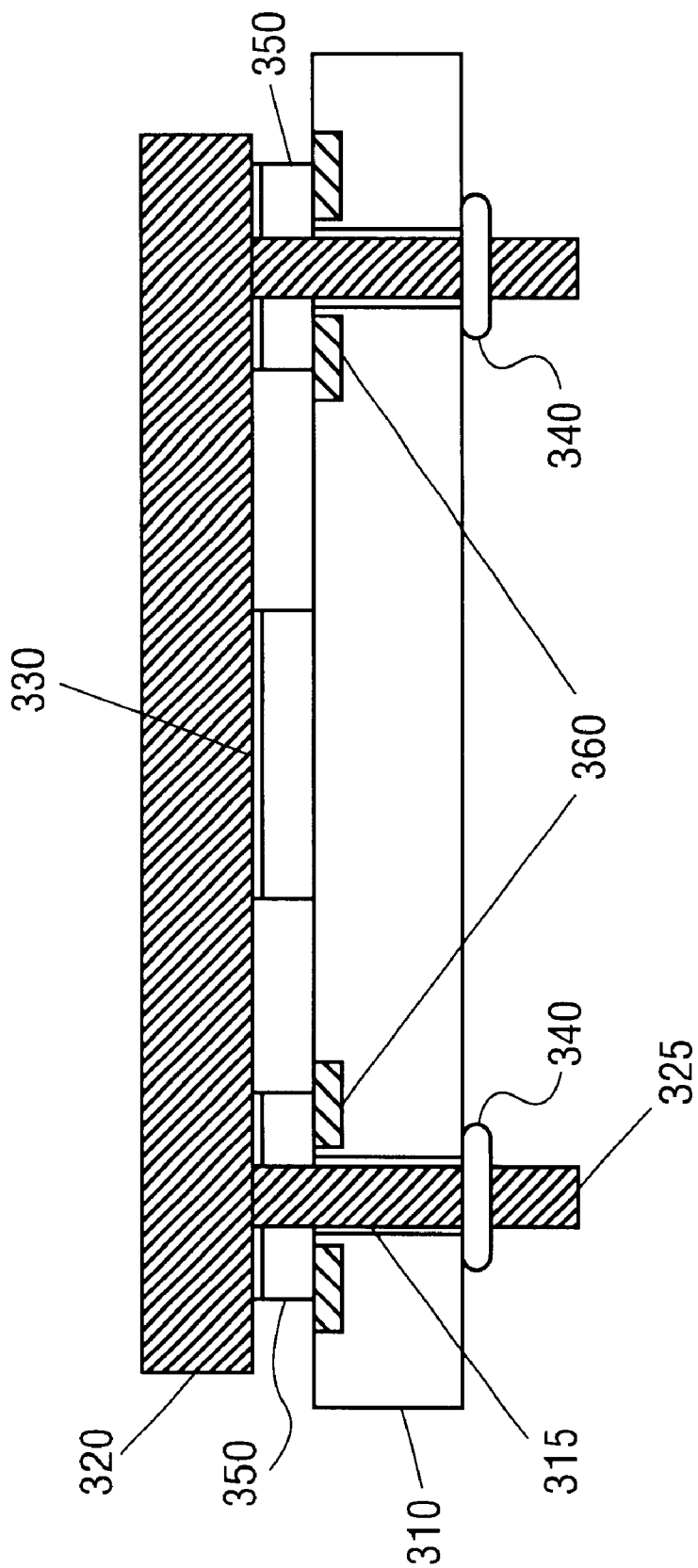
FIG. 3 is an illustration of another embodiment of the system according to the present invention.

FIG. 3 illustrates a cross-section of another embodiment of the present invention. A substrate 310 includes two mounting holes. The substrate 310 includes a conductive pattern 360. The conductive pattern 360 is located proximate to the mounting holes, but not in contact with the mounting holes. The mounting holes 315 are non-conductive. For one embodiment, the mounting holes 315 are isolated from a ground.

The mounting holes are designed to receive pegs from a top surface 320 that is placed over the substrate 310. The top surface 320 is conductive, and includes a plurality of electrically conductive pegs 325 that extend through the mounting holes of the substrate 310. For one embodiment, the top surface 320 is a thermal plate 320 designed to take heat away from electronic circuitry 330 mounted on the substrate 310. For one embodiment, the electronic circuitry 330 is a motherboard. The thermal plate 320 corresponds to the "object" described above in FIG. 2.

Returning to FIG. 3, the thermal plate 320 is fixed to the substrate 310 using clips 340. The thermal plate 320 rests on the electronic circuitry 330 and the body of the thermal plate 320 does not contact the substrate 310. An interface 350 may be placed on the pegs of the top surface 320, between the top surface 320 and the substrate 310. The interface 350 is in electrical contact with both the top surface 320 and the substrate 310. Furthermore, the interface 350 is spaced such that it contacts the conductive pattern 360 on the substrate 310.

For one embodiment, the interface 350 may be made of conductive material or non-conductive material. If the interface 350 is made of a conductive material, the thermal plate 320 is grounded, since the pegs 325 are electrically conductive as well. If the interface 350 is made of an insulating material, the thermal plate 320 is isolated from ground.

Figure 4:
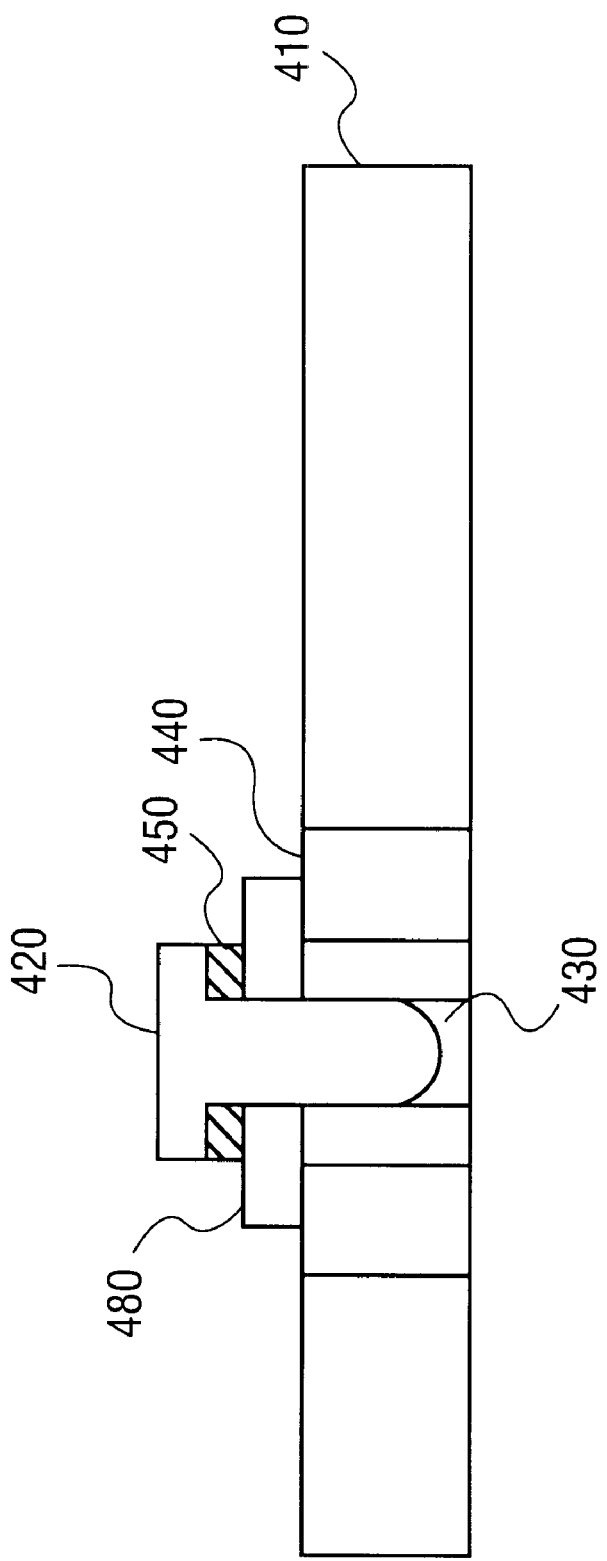
FIG. 4 is an illustration of the cross-section of one embodiment of the present invention.

FIG. 4 is an illustration of a cross-section of one embodiment of the substrate according to the present invention. The sub ate 410 includes a number of mounting holes 430. A conductive pattern 440 is located adjacent to the mounting hole 430. The conductive pattern 440 is in contact with a ground. For one embodiment, the ground is a substrate ground. Therefore, the conductive pattern 440 is grounded. An interface 480 is in electrical contact with the conductive pattern 440. For one embodiment, the interface 480 may be conductive or non-conductive, depending on the planned use. A screw 420 is used to mount the object (not shown except for a mounting corner) 450 to the substrate 410. The screw 420 is physically seperated from the conductive pattern 440 by the interface 480. Therefore, the material used for the screw 420 is irrelevant to the design.

Figure 5:
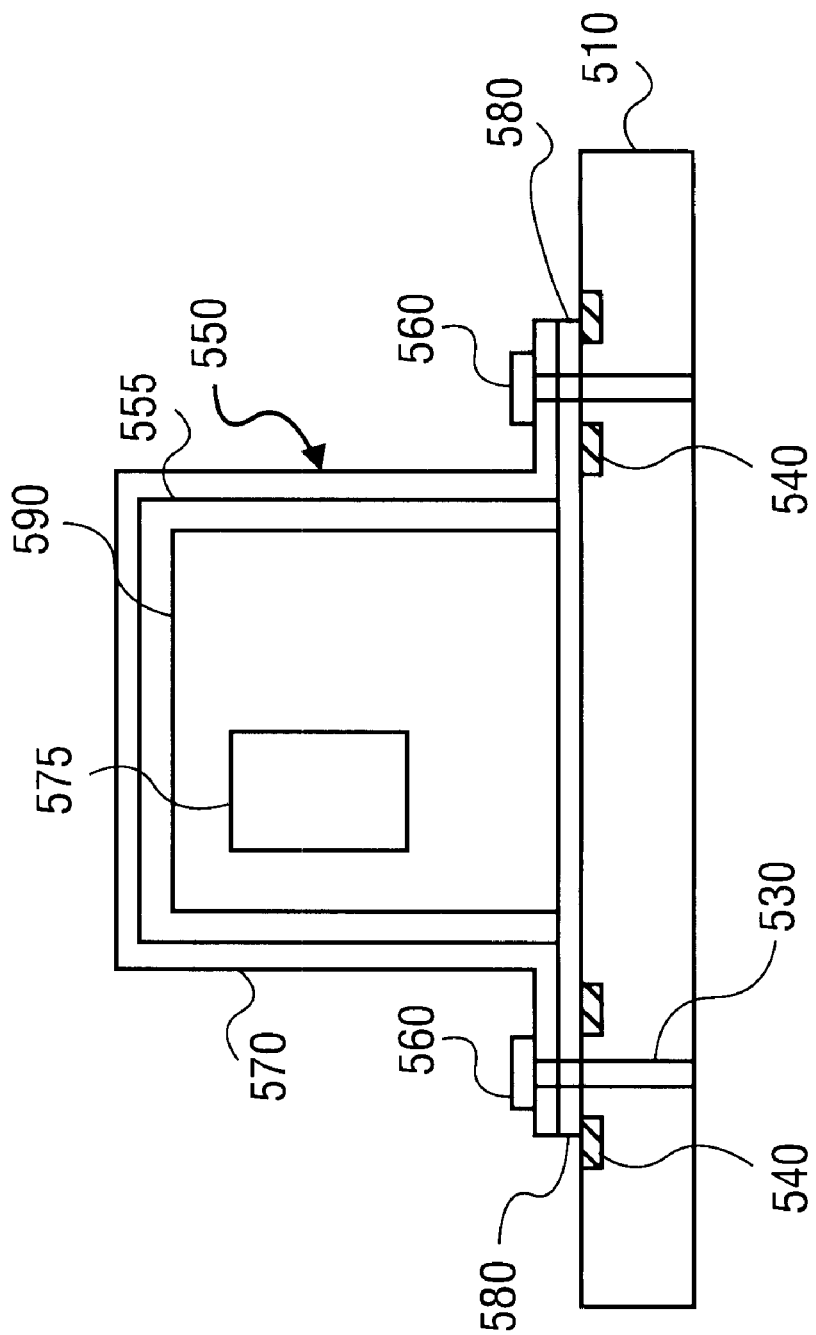
FIG. 5 is an illustration of the cross-section of an alternative embodiment of the substrate.

FIG. 5 is an illustration of an alternative embodiment of the present invention. The substrate 510 includes at least one mounting hole 530. A mounting device 560 is used to fasten an object 550 to the substrate 510. An interface 580 is positioned between the object 550 and the substrate 510. A conductive pattern 540 is located on the substrate 510. The conductive pattern 540 is in electrical contact with the interface 580. The conductive pattern 540 is coupled to a ground connection. For one embodiment, the ground connection to which the conductive pattern 540 is coupled is a substrate ground. For another embodiment, the conductive pattern 540 is coupled to ground via other means.

For one embodiment, the object 550 comprises a case 570, and electronic device 575 within the case 570. For one embodiment, the electronic device 575 is mounted on its own base layer 590 located within the case 570. For one embodiment, the case 570 is made of a hard material, designed to protect the electronic device 575 within the case. For one embodiment, at least part of the case 570 is conductive. The case 570 may be made of metal, or include metallic elements within a non-metal case 570. For an alternative embodiment, the case 570 is non-conductive, but the case 570 includes a conductive liner 555. In that instance, the conductive liner 555 is electrically coupled to the interface 580.

The case 570 and/or the conductive liner 555 is not in direct electrical contact with the electronic device 575 within the case 570. However, ground connections from the electronic device 575 may be coupled to the case 570 and/or conductive liner 555.

For one embodiment, the case 570 is a single edge contact (SEC) cartridge. For one embodiment, the electronic device in the SEC cartridge includes a microprocessor. For one embodiment, the microprocessor is a Pentium ® II microprocessor by Intel Corporation (Santa Clara, Calif.). For high speed signals between the microprocessor and various devices on the substrate, grounding case 570 that may be a cartridge is advantageous. However, in some instances, when the substrate 510 is noisier than the case 570, it is advantageous not to ground the case 570.

Figure 6:
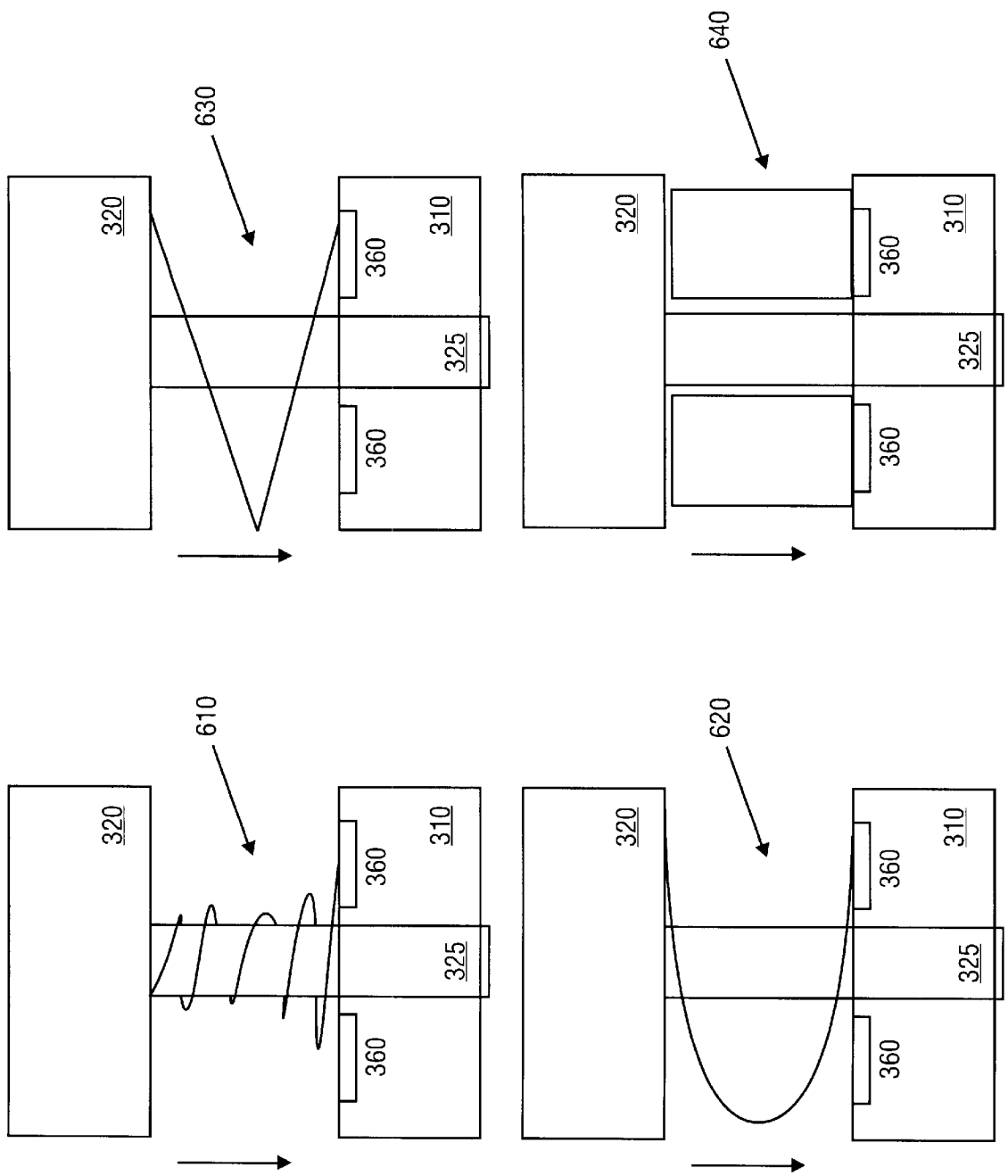
FIG. 6 is an illustration of some embodiments of the interface of the present invention.

FIG. 6 illustrates some of the possible embodiments of the interface of the present invention. The interface is positioned between a top surface 320, or object, and a substrate 310. The top surface 320 in this case is illustrated as a thermal plate 320, having a plurality of electrically conductive posts 325. The substrate 310 includes a conductive pattern 360 electrically coupled to the interface.

One embodiment of the interface is a spring 610. The spring 610 is designed to be simultaneously in contact with the top surface 320 and the conductive pattern 360 when the top surface 320 and the substrate 310 are coupled. embodiment of the interface is a the C-clip 620. Again, the C-clip is coupled between the top surface 320 and the conductive pattern 360. An L-clip 630 may also be used.

Another embodiment of the interface is a washer 640. A washer 640 may be compressible or not compressible. The washer 640 is sized such that it is in contact with both the top surface 320 and the conductive pattern 360 when the top surface 320 and the substrate 310 are aligned.

For one embodiment, the interface 610, 620, 630, 640 is conductive. If the interface 610, 620, 630, 640 is conductive, for one embodiment, the interface 610, 620, 630, 640 is metallic. For one embodiment, the interface 610, 620, 630, 640 is stainless steel. For another embodiment, the interface 610, 620, 630, 640 is non-conductive. The interface 610, 620, 630, 640 may be made of nylon, plastic, ceramic, or any other non-conductive material.

Figure 7:
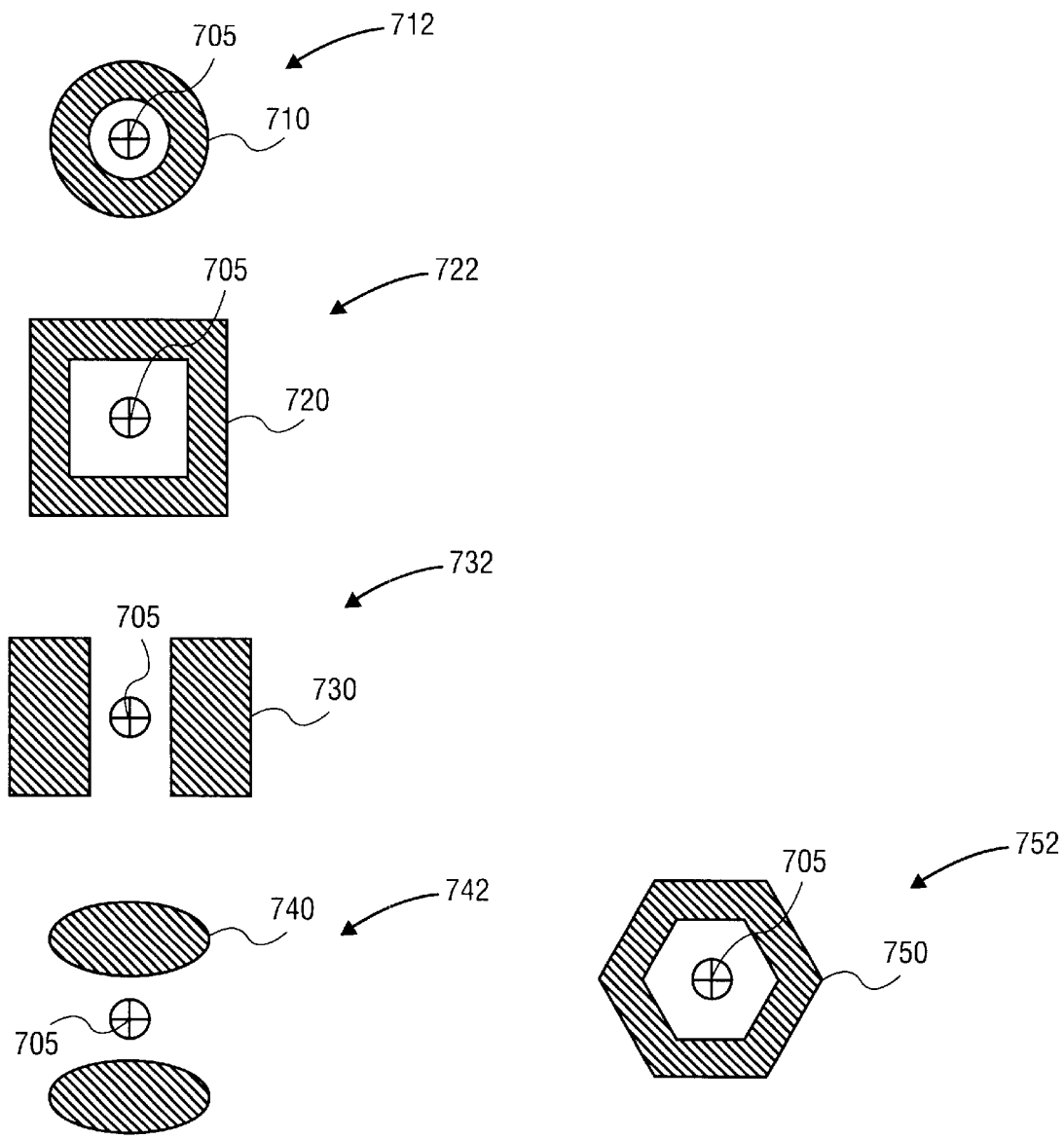
FIG. 7 is an illustration of some of the possible shapes the conductive pattern might take.

FIG. 7 is an illustration of some of the possible shapes the conductive pattern 360 might take. For one embodiment, the shape 712 is an annular ring 710, centered on the mounting hole 705. For another embodiment, the shape 722 is rectangular 720. For another embodiment, the shape 732 of the conductive pattern 730 is two separate rectangles 730, on either side of the mounting hole 705. Alternatively the conductive pattern may be multiple rectangles 730 positioned around the mounting hole 705. For another embodiment, the conductive pattern 742 is multiple ovals 740 distributed around the mounting hole 705. For one embodiment, two ovals 740 are positioned on either side of the mounting hole 705.

For yet another embodiment, the conductive pattern 752 is a random shape 750 centered around the mounting hole 705, but not touching the edge of the mounting hole 705. For one embodiment, the conductive pattern is copper or a similar material that is deposited on the substrate. For another embodiment, the conductive pattern is exposed by etching the substrate to expose an underlying layer of conductive material. As is known in the art, etching a substrate or depositing material on a substrate may be done in any pattern. Therefore, the shape of the conductive pattern is irrelevant to its function. The conductive pattern is of a conductive material, and located proximate to the mounting hole 705, but its specific features may be adapted to the location of the mounting hole 705, the constraints of the substrate design, and any other objects that influence the design of the substrate.

Using the above described interface and conductive pattern combination, a decision to ground or not ground the object may be made at any point prior to removably attaching the object to the substrate. If the decision is changed at a later time, changing from a grounded to a non-grounded object is simple. The interface is simply changed from a conductive to a non-conductive material. This is advantageous because it permits decision making at a later stage in the design. Furthermore, it permits a decision at the time of installation.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:

an object;

a substrate that defines a plurality of mounting holes;

a conductive pattern formed on the substrate and adjacent to the mounting holes; and an interface for each mounting hole, the interface disposed on the substrate adjacent to the mounting hole and not within the mounting hole to couple electrically the object to the substrate via the conductive pattern or to insulate the object from the substrate.

2. The apparatus of claim 1, wherein the interface is non-conductive.

3. The apparatus of claim 1, wherein the interface is conductive.

4. The apparatus of claim 1, wherein the interface includes washer, a spring, a c-clip, or an L-clip.

5. The apparatus of claim 4, wherein the object comprises a thermal plate including a body and at least one post designed to extend through one of the mounting holes, and wherein the interface is further disposed between the substrate and the body of the thermal plate.

6. The apparatus of claim 4, wherein the object comprises a case having a fastening aperture, and the apparatus further comprises a mounting device to couple the object to the substrate through one of the mounting holes.

7. The apparatus of claim 1, wherein the conductive pattern includes a copper pattern.

8. The apparatus of claim 7, wherein the conductive pattern includes an annular ring concentric with each mounting hole.

9. The apparatus of claim 1, wherein the conductive pattern is grounded.

10. The apparatus of claim 1, wherein the substrate is grounded on a backside of the substrate.

11. The apparatus of claim 10, wherein the conductive pattern is directly connected to the backside of the substrate.

12. The apparatus of claim 11, wherein the conductive pattern includes an exposed copper pattern that is formed on a top side of the substrate, the exposed copper pattern is grounded.

13. The apparatus of claim 1, wherein the conductive pattern includes a metal pattern formed on a top surface of the substrate.

14. An apparatus comprising:

an object;

a substrate that defines a plurality of mounting holes, each mounting hole to permit coupling of the object to the substrate;

a conductive pattern formed on the substrate adjacent to each mounting hole; and an interface for each mounting hole, the interface disposed on the substrate adjacent to the mounting hole and not within the mounting hole, the interface to ground the object with the substrate or to prevent the object from being grounded with the substrate, and wherein the interface is conductive if the object is to be grounded or is non-conductive if the object is not to be grounded.

15. An apparatus comprising:

a substrate defining a plurality of mounting holes;

conductive patterns formed on the substrate adjacent to the plurality of mounting holes;

a conductive thermal plate including a body and a plurality of posts positioned to fit into the plurality of mounting holes;

and an interface disposed on the substrate adjacent to at least one of the plurality of posts of the thermal plate and not with the mounting holes, the interface designed to couple electrically or to isolate the thermal plate and the conductive patterns with the substrate, wherein the interface is conductive to couple electrically the thermal plate and the conductive patterns or is non-conductive to isolate the thermal plate and the conductive patterns.

* * * * *

UNITED STATES PATENT AND TRADEMARK OFFICE
CERTIFICATE OF CORRECTION

PATENT NO. : 6,369,333 B1
DATED : April 9, 2002
INVENTOR(S) : Yee

It is certified that error appears in the above-identified patent and that said Letters Patent is hereby corrected as shown below:

Column 3,
Line 35, delete "sub ate" and insert -- substrate --.
Line 45, delete "seperated" and insert -- separated --.

Column 4,
Line 32, delete "substrate 310" and insert -- conductive pattern 360 --.
Lines 32-33, delete "coupled. embodiment" and insert -- coupled. Another embodiment --.
Lines 33-34, delete "C-clip is coupled" and insert -- C-clip 620 is coupled --.
Line 55, delete "pattern 730 is" and insert -- pattern is --.
Line 57, delete "pattern may be" and insert -- pattern 732 may be --.

Signed and Sealed this

Eighth Day of October, 2002

Attest:

JAMES E. ROGAN
Attesting Officer    Director of the United States Patent and Trademark Office